FIELD EFFECT TRANSISTOR AMPLIFIER

Filed Feb. 26, 1969 3 Sheets-Sheet 1

INVENTORS
SHIN-ICHI OHASHI
HIROSHI NOMOTO

BY Craig, Antonelli, Stewart & Hill
ATTORNEYS

INVENTORS
SHIN-ICHI OHASHI
HIROSHI NOMOTO

BY Craig, Antonelli, Stewart & Hill
ATTORNEYS

INVENTORS
SHIN-ICHI OHASHI
HIROSHI NOMOTO

BY Craig, Antonelli, Stewart & Hill
ATTORNEYS

United States Patent Office 3,546,615
Patented Dec. 8, 1970

3,546,615

FIELD EFFECT TRANSISTOR AMPLIFIER

Shin-Ichi Ohashi, Kodaira-shi, and Hiroshi Nomoto, Hachioji-shi, Japan, assignors to Hitachi Ltd., Tokyo, Japan, a corporation of Japan Filed Feb. 26, 1969, Ser. No. 802,487
Claims priority, application Japan, Mar. 1, 1968, 43/12,912
Int. Cl. H03f 3/16, 3/68
U.S. Cl. 330—24 3 Claims

ABSTRACT OF THE DISCLOSURE

A field effect transistor amplifier using an element having a high internal impedance at a given low current region (e.g. less than 10 $\mu$A.), as a load whereby a sufficiently large gain is obtained even by the field effect transistor of low mutual conductance.

BACKGROUND OF THE INVENTION

Feld of the invention

This invention relates to a field effect transistor amplifier with a diode as a load, which operates at a low current level and whose consumption power is extremely small.

Description of the prior art

In semiconductor amplifiers having a small power capacity and requiring long time operation, such as used in devices in a teletransmittal system, medical electronics and space electronics, the consumption power must be made as small as possible.

For this purpose the amplifier circuit should be operated at a low level operating current.

However, in an amplifier using field effect transistors (hereinafter referred to as FET) the gain or the amplifying efficiency is lowered with a decrease of drain current level. The characteristic equation of FET is given by $$I_D = I_{DSS}\left(1-\frac{V_{GS}}{V_P}\right)^2 \quad (1)$$

where $I_D$ is the drain current, $I_{DSS}$ the saturation drain current, $V_P$ the pinch-off voltage, and $V_{GS}$ the gate voltage.

From Eq. (1) the mutual conductance $g_m$ is expressed by $$g_m = \frac{\partial I_D}{\partial V_{GS}} = g_{mo}\left(1-\frac{V_{GS}}{V_P}\right) = g_{mo}\sqrt{\frac{I_D}{I_{DSS}}}\,\alpha\sqrt{I_D} \quad (2)$$

where $$g_{mo} = -\frac{2I_{DSS}}{V_P}$$

It is seen, therefore, that $g_m$ is proportional to $I_D$ and therefore it becomes small at a low level of $I_D$. Namely, $g_m$ is lowered with a decrease of $I_D$. However, the voltage gain G is given by $$G = g_m \cdot R_L \quad (3)$$

where $R_L$ is the load impedance.

So, if the load impedance $R_L$ is large enough, a high gain is obtainable even with a low $g_m$.

SUMMARY OF THE INVENTION

In view of this fact, the object of this invention is to provide an amplifier using as a load an element presenting a high internal impedance at a given low current region (e.g. less than 10 $\mu$A.) so that a sufficiently high actual gain is obtained even with a FET of low mutual conductance.

In order to accomplish the above object a FET amplifier of low level operation is formed by using a PN junction diode with backward or forward direction bias as a load.

Detailed explanation of the construction, functions and effects of this invention will be made hereinafter with reference to the accompanying drawings.

DESCRIPTION OF THE PREFERRED EMBODIMENTS

First, explanation will be made of the voltage-current characteristic curve of a conventional silicon PN junction diode given a backward bias with reference to the semi-logarithmic diagram shown in FIG. 1, the ordinate being the current (order of $10^{-9}$ A.) and the abscissa being the voltage (V).

The curve *a* shows the characteristic of a diffusion type diode which presents an internal resistance of about $1\times10^{10}\ \Omega$ at a current of about $1\times10^{-9}$ A. while the curve *b* shows that of a planar type diode which presents about $5\times10^{10}\ \Omega$ at about $1\times10^{-10}$ A.

Therefore, with $g_{mo}=3m\nu$ and $I_{DSS}=3$ mA. in Eq. (2) we have $g_m \fallingdotseq 1.7\times10^{-6}\ \nu$ at $I_D=1\times10^{-9}$ A. In the curve *a* where the internal resistance is $1\times10^{10}\ \Omega$ at $I_D=1\times10^{-9}$ A. Eq. (3) gives $$G = g_m \cdot R_L = 1.7\times10^{-6}\times1\times10^{10} = 1.7\times10^4 = 86 \text{ db}$$

where it is assumed that the input signal frequency is less than 1 Hz.

Although the actual low level operation deviates from that given by the characteristic Eqs. (1) and (2) toward a smaller gain, in practice the gain is satisfactory.

Figure 1:
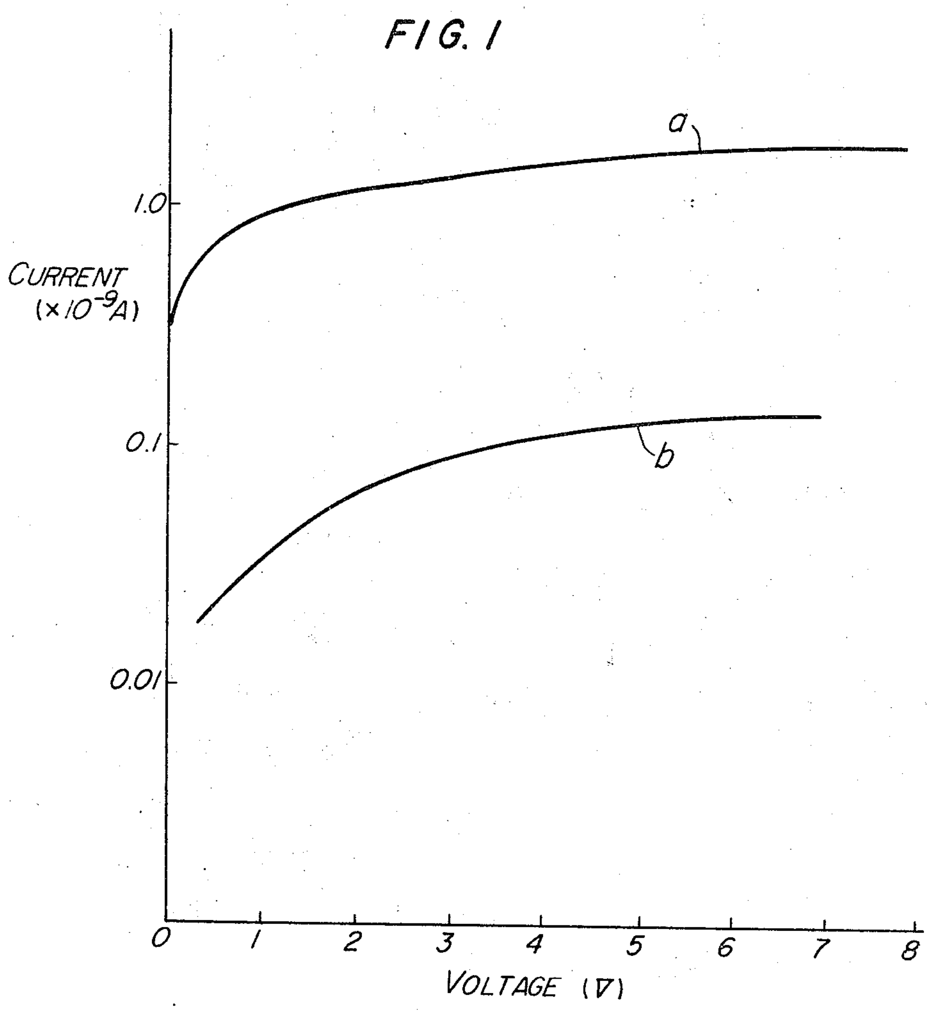
FIG. 1 is a voltage-current characteristic curve of a junction type diode given a backward bias used in this invention.
Figure 2:
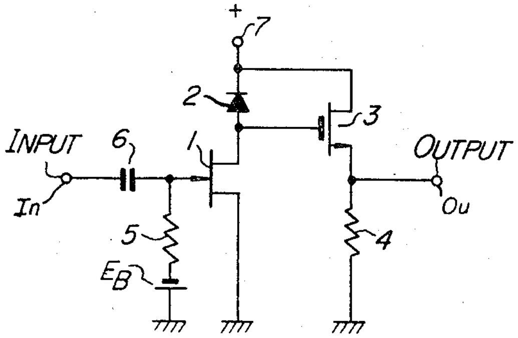
FIG. 2 is a circuit diagram showing the circuitry construction according to an embodiment of this invention.

FIG. 2 is a circuit diagram showing the construction according to one embodiment of this invention where the above-mentioned diode given a backward bias is used as a load. 1 is a junction type FET used as an amplifying element ($I_{DSS}=3$ mA., $g_{mo}=3\ m\nu$), 2 is a diode of backward bias with the characteristic curve *b* as shown in FIG. 1 connected to an electrode of FET 7 to form a load, 3 is an insulated gate FET forming a source follower to derive an output signal, 4 is a bias resistor connected to the source electrode of FET 3, $E_B$ is a bias voltage source for FET 1, 5 is a resistor for giving the bias, 6 is a capacitor cutting off the direct current flowing toward the input from the bias voltage source, 7 is a positive terminal of the source, $I_n$ is an input terminal connected to the gate electrode of FET 1 through the capacitor 6, and $O_u$ is an output terminal connected to the source electrode of FET 3.

Figure 3:
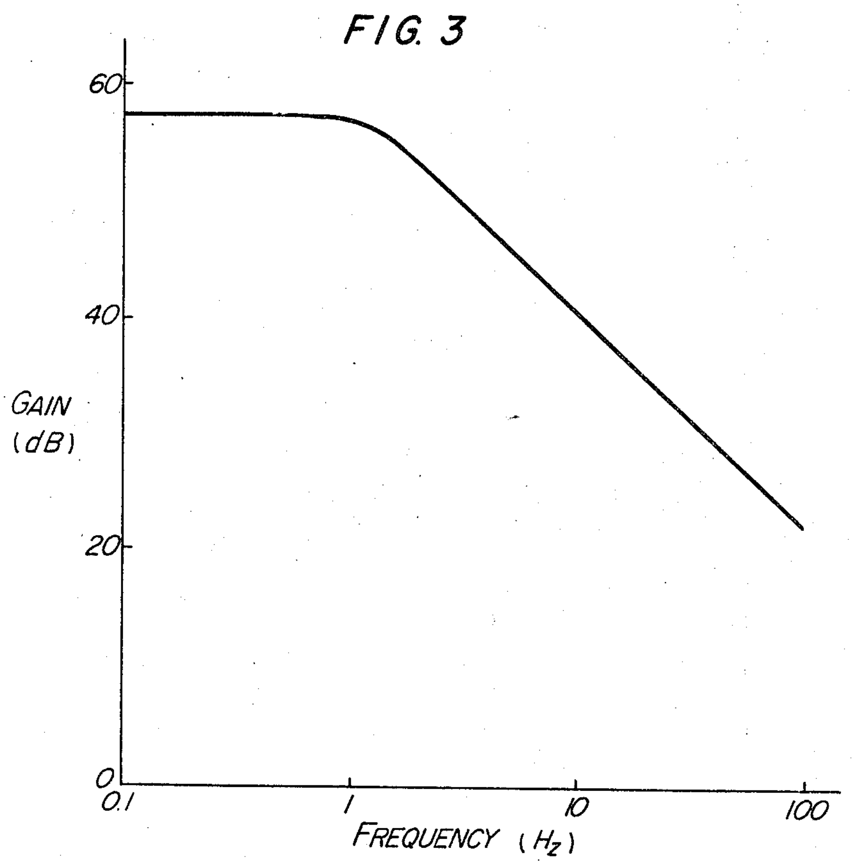
FIG. 3 shows the gain-frequency characteristic curves of the circuit shown in FIG. 2.

In this circuit arrangement, when the drain current $I_D$ of FET 1 is set $1.1\times10^{-9}$ A., the actual gain-frequency characteristic of an input signal at the input terminal $I_n$ becomes as shown in FIG. 3, where the ordinate is the gain and the abscissa is the semilogarithm of the frequency. As seen from this characteristic curve, the gain is 47 db below 1 Hz. and decreases by 20 db/decade (first-order lag characteristic) above 1 Hz.

Whereas the conventional transistor amplifier needs a consumption power of a few $\mu$w. when current amplification factor (HFE) is less than one (substantially zero), namely, the conventional transistor amplifier reaches its amplification limit, the FET amplifier of low level operation with the backward biased diode as a load needs only an order of m$\mu$w. with an operation current of $1\times10^{-10}$ to $1\times10^{-9}$ A. and a source voltage of 2 to 3 v. Furthermore, the above FET amplifier can have an actual gain of more than 20 db even with one stage.

The operation amplifiers used in an analog computer, etc. obtain a gain of the order of 100 db with 3 to 4 circuit stages. For a stable negative feedback various external phase adjustments are needed to get approximately a first-order lag phase characteristic. According to this invention, since the junction capacity of the diode serves to yield the first-order phase lag characteristic, the necessity of external phase adjustments disappears.

Figure 4:
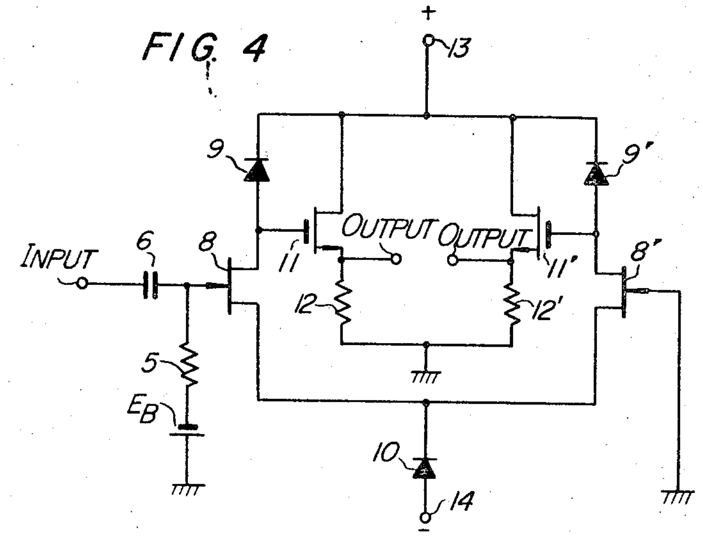
FIG. 4 is a circuit diagram showing the circuitry construction according to another embodiment of this invention.
Figure 5:
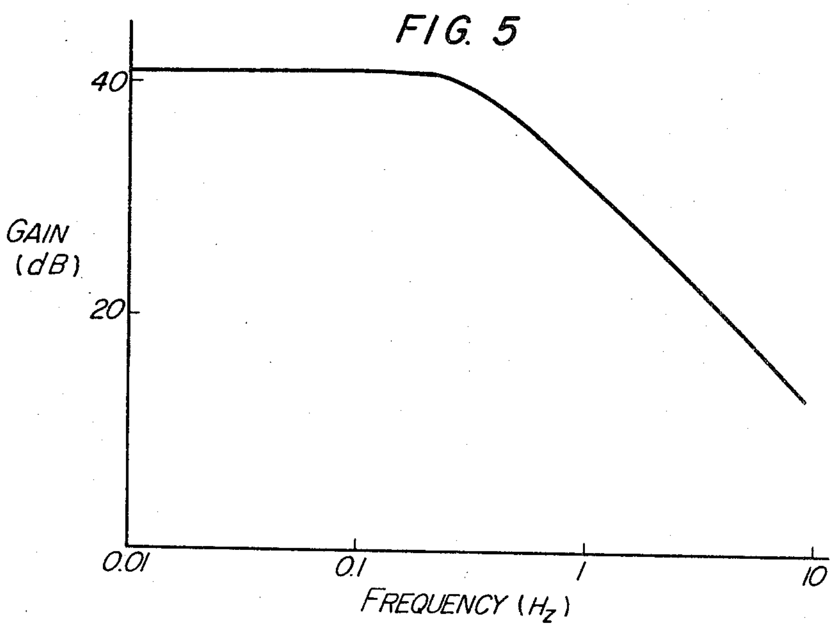
FIG. 5 shows the gain-frequency characteristic curves of the circuit shown in FIG. 4.

FIG. 4 shows a two-stage differential amplifier according to another embodiment of this invention. 8 and 8' are the first stage junction FET. The input signal is applied to the gate electrode of FET 8. The gate electrode of FET 8' is grounded. 9 and 9' are loads of backward biased diodes connected to the drain electrodes of FET 8 and 8'. 10 is a backward biased diode connected to the source electrodes of FET 8 and 8' to form a constant current source. 11 and 11' are insulated gate type FET's forming the second stage amplifiers receiving the outputs from the loads 9 and 9'. The gate electrodes of FET 11 and 11' are connected to the drain electrodes 8 and 8' respectively and their outputs are derived from the source electrodes. 12 and 12' are resistor elements for giving a bias, both having each one end connected to the sources of FET 11 and 11' and the other ends grounded. 13 and 14 are positive and negative source terminals respectively. Other reference numerals are used to denote like parts as shown in FIG. 2. The actual gain-frequency characteristic obtained by this construction is shown in FIG. 5 which exhibits substantially the same characteristic as that in FIG. 3.

Although in the above description a backward biased junction type diode is used as the load of FET amplifier of low level operation, a forward biased junction type diode may also be used. Namely, the fact that the internal resistance of a junction type diode varies in inverse proportion to the current I is utilized. The current I is expressed as $$I=I_0\left(\epsilon^{\frac{qV}{KT}}-1\right) \qquad (4)$$

where V is the input voltage of the junction type diode, $I_0$ the saturation current, $q$ the electron charge, K Boltzmann's constant and T the absolute temperature. The internal resistance $r_D$ of the diode is given by $$\frac{1}{r_D}=\frac{\delta I}{\delta V}=\frac{qI_0}{KT}\epsilon^{\frac{qV}{KT}}=\frac{q(I+I_0)}{KT}\simeq\frac{qI}{KT}\alpha I \qquad (5)$$

The resistor $r_D$ is inversely proportional to the current I.

When the forward biased junction type diode is used as a load of the FET amplifier of low level operation, we have from Eqs. (2), (3) and (5).

$$G=g_m\cdot R_L=-2\frac{\sqrt{I_{DSS}}}{VP}\sqrt{ID}\cdot\frac{KT}{qI} \qquad (6)$$

Since $I=I_D$, $$G=-2\frac{KT}{qV_P}\cdot\frac{\sqrt{I_{DSS}}}{\sqrt{I_D}}\alpha\frac{1}{\sqrt{I_D}} \qquad (7)$$

The above equation shows that the gain is increased as the current $I_D$ decreases. Practically, however, the actual gain is smaller than the theoretical gain.

Figure 6:
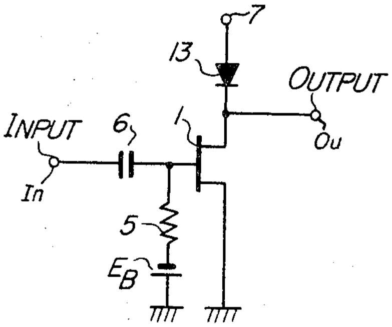
FIG. 6 is a circuit diagram showing the circuitry construction according to another embodiment of this invention.
Figure 7:
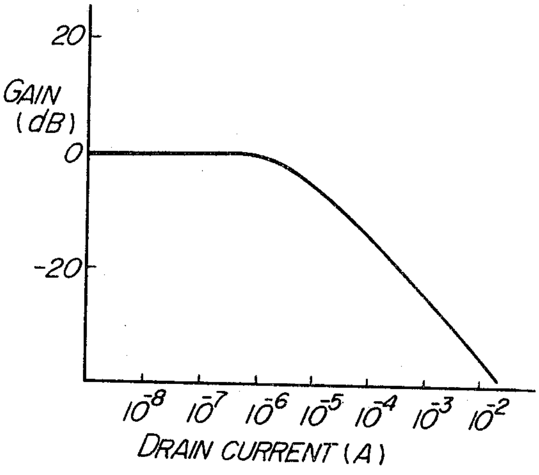
FIG. 7 shows the gain-current characteristic curve of the circuit shown in FIG. 6.

FIG. 6 shows a circuit diagram of the construction according to another embodiment of this invention, in which a forward biased junction type diode is used as load. In this figure, like reference numerals are used to denote like parts as shown in FIG. 2. 13 shows the forward biased junction type diode used as load and connected to the drain electrode of FET 1. The input and output terminals $I_n$ and $O_u$ are connected to the gate and the drain electrode of FET 1 respectively. The gain characteristic obtained is as shown in FIG. 7, the ordinate being the gain G and the abscissa being the drain current $I_D$. The gain saturates below $10^{-5}$ A. and above it decreases in inverse proportion to $\sqrt{I_D}$.

Figure 8:
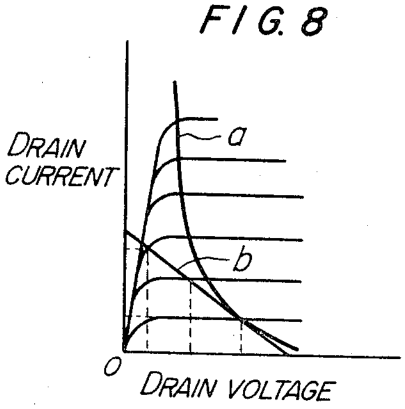
FIG. 8 is a characteristic curve explaining this invention.

The FET amplifier constructed in this manner is free from instability at the operational point which occurs when a high resistance load is used. In FIG. 8 showing the characteristic of drain current $I_D$ vs. drain voltage $V_D$, the curves *a* and *b* are the load curves of a diode (its resistance 100 MΩ at $I_D=10^{-10}$ A.) and of a resistance element (its value 100 MΩ) respectively. It is seen that with the diode load the drain voltage $V_D$ is varied little by the drain current $I_D$.

It is possible to connect a plurality of diodes in series to increase the gain. Furthermore, in order to keep the drain current $I_D$ at a low level a differential amplifier similar to the aforementioned one with a backward biased diode can also be formed.

As mentioned above the advantages of the FET amplifier according to this invention using a diode load with a high internal impedance at a given low current region e.g. less than 10 $\mu$A. are:

(1) An amplifier with an extremely small power consumption is obtainable with e.g. an operation current $1\times10^{-10}$ A. and a source voltage 2 to 3 v., and hence a consumption power of $1\times10^{-10}\times3=0.3$ m$\mu$w. whereas a conventional amplifier needs at least a few $\mu$w.

(2) Since a junction type diode is used as load, the integration of a high resistance load which has been heretofore difficult becomes possible, and so the integration of an amplifier having a high resistance load becomes easily possible. As a result, extreme miniaturization of the device with a small power capacity and capable of long time operation which is suited to the engineering of space communications and medical electronics is attained.

(3) The junction capacity of the diode used as load can realize a simple first-order lag phase characteristic as seen commonly in operational amplifiers with negative feedback. Although such an operational amplifier, if integrated, requires a phase adjustment capacitor externally, because the integration of capacitors is difficult, in this invention, the combination of the high resistance and the junction capacitance of the diode is enough to give a time constant in the order of 0.01 to 10 sec.

(4) In spite of the low level operation the gain is practically high. Specifically, when a backward biased diode is used as load, a first stage amplifier is sufficient to give a considerable gain.

Although the above description has been made of an amplifier with a junction type FET, this invention is not limited thereto but may be quite equally applied to an amplifier with an insulated gate type FET.

What is claimed is:

1. An amplifier comprising a field effect transistor whose gate and drain electrodes are connected to the signal input and output respectively with the source electrode grounded, and a reverse-biased diode connected to said electrode as a load presenting a high internal impedance in a given current region to thereby provide low current level operation of said field effect transistor.

2. An amplifier as defined in claim 1, which further comprises a source resistor and an insulated gate type field effect transistor having an insulated gate and a drain electrode between which said diode is connected, and a source electrode grounded through said source resistor to form a source follower circuit, whereby the output is derived from said source electrode.

3. A differential amplifier comprising:

a pair of transistors comprising first and second field effect transistors, each having a source electrode supplied with a source potential, a drain electrode and a gate electrode;

first and second reverse-biased diodes connected to said drain electrode of the respective first and second field effect transistors as a load respectively in such a manner that said diodes present a high internal impedance in a given current region to thereby maintain said field effect transistors in their low current level operations;

first and second source resistors;

first and second insulated gate type field effect transistors, each having a gate and a drain electrode between which said first and second diodes are connected respectively, and a source electrode which is grounded through said source resistors respectively, to thereby form source follower circuits;

input means for impressing an input signal between the gate electrodes of said field effect transistors; and output means for deriving an output signal from the source electrodes of said insulated gate type field effect transistors.

References Cited

UNITED STATES PATENTS

| | | | |
|---|---|---|---|
| 3,135,926 | 6/1964 | Bockemuehl | 307—304X |
| 3,311,756 | 3/1967 | Nagata et al. | 330—35X |
| 3,449,687 | 6/1969 | Knauber et al. | 330—38X |

OTHER REFERENCES

Barton, "The Field-Effect Transistor Used as a Low-Level Chopper," Electronic Engineering, February 1965, pp. 80, 81.

Scott, "Getting To Know Low-Cost IC's," Radio-Electronics, March 1967, pp. 44–46.

ROY LAKE, Primary Examiner

J. B. MULLINS, Assistant Examiner

U.S. Cl. X.R.

330—30, 35